United States Patent
Kimura

(10) Patent No.: US 6,887,726 B2
(45) Date of Patent: May 3, 2005

(54) SEMICONDUCTOR LAYER FORMED BY SELECTIVE DEPOSITION AND METHOD FOR DEPOSITING SEMICONDUCTOR LAYER

(75) Inventor: Akitaka Kimura, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/161,981

(22) Filed: Sep. 29, 1998

(65) Prior Publication Data

US 2004/0023423 A1 Feb. 5, 2004

(30) Foreign Application Priority Data

Sep. 29, 1997 (JP) .............................................. 9-264225

(51) Int. Cl.[7] .............................................. H01L 21/00
(52) U.S. Cl. ........................................ 438/22; 438/483
(58) Field of Search ..................... 438/22–47, 479–509, 438/478; 117/84, 104, 105

(56) References Cited

U.S. PATENT DOCUMENTS

| | | | | |
|---|---|---|---|---|
| 5,420,198 A | * | 5/1995 | Papazoglou et al. | |
| 5,438,583 A | * | 8/1995 | Narui et al. | |
| 5,962,875 A | * | 10/1999 | Motoki et al. | 257/103 |
| 6,030,849 A | * | 2/2000 | Hasegawa et al. | 438/46 |
| 6,111,277 A | * | 8/2000 | Ikeda | 257/99 |
| 6,133,058 A | * | 10/2000 | Kodiguchi et al. | 438/47 |
| 6,177,688 B1 | * | 1/2001 | Linthicum et al. | 257/77 |
| 6,187,606 B1 | * | 2/2001 | Edmond et al. | 438/39 |
| 6,284,559 B1 | * | 9/2001 | Hata | |
| 6,326,638 B1 | * | 12/2001 | Kamiyam et al. | 257/13 |
| 6,377,596 B1 | | 4/2002 | Tanaka et al. | |
| 6,455,337 B1 | * | 9/2002 | Sverdlov | 438/22 |
| 6,498,048 B2 | * | 12/2002 | Morita | 438/22 |
| 6,617,182 B2 | * | 9/2003 | Ishida et al. | 438/22 |

FOREIGN PATENT DOCUMENTS

| | | |
|---|---|---|
| JP | H04-340284 | 11/1992 |
| JP | H08-18159 | 1/1996 |
| JP | H08-264454 | 10/1996 |
| JP | H09-036473 | 2/1997 |
| JP | H09-036475 | 2/1997 |
| JP | H09-199791 | 7/1997 |
| JP | 012900 | * 1/2000 |
| WO | WO97/11518 A1 | 3/1997 |

OTHER PUBLICATIONS

Nakamura et al., Ridge–geometry InGaN multi–quantum–well–structure laser diodes, Appl. Phys. Lett., 69(1996) 1577.
S. Nakamura et al., Bluish–Pruple InGaN Multi–Quantum Well Structure Laser Diodes, Extended Abstracts of 1996 International Conference on Solid State Devices and Materials, Yokohama, 1996, pp. 67–69.

* cited by examiner

Primary Examiner—Savitri Mulpuri
(74) Attorney, Agent, or Firm—Sughrue Mion, PLLC

(57) ABSTRACT

In a method for fabricating a nitride-based semiconductor laser which forms, by a selective deposition, a current narrowing structure and a structure confining a light in a horizontal direction in parallel to a substrate, when the nitride-based semiconductor is selectively deposited by a metal organic chemical vapor deposition, silicon generated by decomposition of the silicon oxide film used as the mask for the selective deposition is prevented from being deposited on a re-growth boundary. For this purpose, a silicon nitride film is used as the mask for the selective deposition, and when the nitride-based semiconductor is selectively deposited by the metal organic chemical vapor deposition, a V-group material of the nitride-based semiconductor, namely, a nitrogen material, for example, ammonia, is supplied so that the decomposition of the silicon nitride film used as the mask for the selective deposition, is prevented.

16 Claims, 9 Drawing Sheets

US 6,887,726 B2

SEMICONDUCTOR LAYER FORMED BY SELECTIVE DEPOSITION AND METHOD FOR DEPOSITING SEMICONDUCTOR LAYER

BACKGROUND OF THE INVENTION

1. Field of the Invention

The present invention relates to a semiconductor layer formed by a selective deposition and a method for depositing the semiconductor layer, and more specifically to a semiconductor layer which is not mixed with a material of a mask for the selective deposition and a method for depositing the semiconductor layer.

Furthermore, the present invention relates to a nitride-based semiconductor layer formed by the selective deposition and a method for depositing the nitride-based semiconductor layer, and more specifically to a nitride-based semiconductor layer which is not mixed with a material of a mask for the selective deposition and a method for depositing the nitride-based semiconductor layer.

In addition, the present invention relates to a nitride-based semiconductor light emitting device formed by the selective deposition and a method for fabricating the nitride-based semiconductor light emitting device, and more specifically to a nitride-based semiconductor light emitting device having a selective-deposited layer which is not mixed with a material of the mask for the selective deposition, with no enlargement of the opening of a mask for the selective deposition, and a method for fabricating the nitride-based semiconductor layer light emitting device.

2. Description of Related Art

Gallium nitride has a forbidden band of 3.4 eV, which is larger than those of other compound semiconductors such as indium phosphide and gallium arsenide. Therefore, there has been realized a device which uses a semiconductor including nitrogen as a constituent element (called a "nitride-based semiconductor" hereinafter) and which emits light having a relatively short wavelength from green to ultraviolet, (this device will be called a "nitride-based semiconductor light emitting device" hereinafter), for example, such a light emitting diode (called a "nitride-based semiconductor light emitting diode" hereinafter), and such a semiconductor laser (called a "nitride-based semiconductor laser" hereinafter). The nitride-based semiconductor can mainly assume two kinds of crystal structure, a hexagonal crystal and a cubic crystal, depending upon a forming method, and ordinarily, the hexagonal crystal structure is stable in energy.

PRIOR ART EXAMPLE 1

FIG. 6 is a diagrammatic sectional view of the nitride-based semiconductor laser fabricated in accordance with a prior art fabricating method (S. Nakamura et al., Extended Abstracts of 1996 International Conference on Solid State Devices and Materials, Yokohama, 1996, pp.67–69).

Referring to FIG. 6, in this nitride-based semiconductor laser includes, on a sapphire substrate 201 having a principal surface of a (11$\bar{2}$0) plane, there are formed a 300 Å-thick undoped gallium nitride buffer layer 102 grown at a low temperature, a 3 μm-thick contact layer 103 of silicon-doped n-type gallium nitride, a 0.1 μm-thick crack preventing layer 104 of silicon-doped n-type $In_{0.05}Ga_{0.95}N$, a 0.4 μm-thick clad layer 105 of silicon-doped n-type $Al_{0.07}Ga_{0.93}N$, a 0.1 μm-thick light guide layer 106 of silicon-doped n-type gallium nitride, a multi-quantum well structure active layer 107 of seven periods consisting of 25 Å-thick undoped $In_{0.2}Ga_{0.5}N$ quantum well layers and 50 Å-thick undoped $In_{0.05}Ga_{0.95}N$ barrier layers, a 200 Å-thick indium dissociation preventing layer 108 of magnesium-doped p-type $Al_{0.2}Ga_{0.5}N$, a 0.1 μm-thick light guide layer 109 of magnesium-doped p-type gallium nitride, a 0.4 μm-thick clad layer 110 of magnesium-doped p-type $Al_{0.07}Ga_{0.93}N$, a 0.2 μm-thick contact layer 111 of magnesium-doped p-type gallium nitride, a p-electrode 112 formed of nickel (a first layer) and gold (a second layer), and an n-electrode 113 formed of titanium (a first layer) and aluminum (a second layer).

All of the semiconductor layers of the prior art nitride-based semiconductor laser shown in FIG. 6 are a hexagonal crystal having a surface of a (0001) plane. In addition, in the prior art nitride-based semiconductor laser shown in FIG. 6. all the semiconductor layers ar, formed on the planar sapphire substrate 201 by a crystal growth.

PRIOR ART EXAMPLE 2

FIG. 7 is a diagrammatic sectional view of the nitride-based semiconductor laser fabricated in accordance with another prior art fabricating method (S. Nakamura et al., Appl. Phys. Lett., 69(1996) 1577). In FIG. 7, on a sapphire substrate 201 having a principal surface of a (11$\bar{2}$0) plane, there are formed a 300 Å-thick undoped gallium nitride buffer layer 102 grown at a low temperature, a 3 μm-thick contact layer 103 of silicon-doped n-type gallium nitride, a 0.1 μm-thick crack preventing layer 104 of silicon-doped n-type $In_{0.05}Ga_{0.95}N$, a 0.5 μm-thick clad layer 605 of silicon-doped n-type $Al_{0.05}Ga_{0.95}N$, a 0.1 μm-thick light guide layer 106 of silicon-doped n-type gallium nitride, a multi-quantum well structure active layer 707 of seven periods consisting of 30 Å-thick undoped $In_{0.2}Ga_{0.5}N$ quantum well layers and 60 Å-thick undoped $In_{0.05}Ga_{0.95}N$ barrier layers, a 200 Å-thick indium dissociation preventing layer 108 of magnesium-doped p-type $Al_{0.2}Ga_{0.5}N$, a 0.1 μm-thick light guide layer 109 of magnesium-doped p-type gallium nitride, a 0.5 μm-thick clad layer 710 of magnesium-doped p-type $Al_{0.05}Ga_{0.95}N$, a 0.2 μm-thick contact layer 111 of magnesium-doped p-type gallium nitride, a p-electrode 112 formed of nickel (a first layer) and gold (a second layer), an n-electrode 113 formed of titanium (a first layer) and aluminum (a second layer), and a silicon oxide film 215.

All of the semiconductor layers of the prior art nitride-based semiconductor laser shown in FIG. 7 are a hexagonal crystal having a surface of a (0001) plane. In addition, in the prior art nitride-based semiconductor laser shown in FIG. 7, after all the semiconductor layers are formed on the planar sapphire substrate 201 by a crystal growth, the stacked structure is partially removed by a dry etching so as to form a ridge structure.

PRIOR ART EXAMPLE 8

FIG. 8 is a diagrammatic sectional view of the nitride-based semiconductor laser fabricated in accordance with a fabricating method (disclosed in Japanese Patent Application No. Heisei 08-343125 which was laid open on Jul. 21, 1998 as JP-A-190142. Now, the structure of the prior nitride-based semiconductor laser shown in FIG. 8 will be described. On a sapphire substrate 201 having a principal surface of a (110) plane, there are formed a 300 Å-thick undoped gallium nitride buffer layer 102 grown at a low temperature, a 3 μm-thick contact layer 103 of silicon-doped n-type gallium nitride, a 0.1 μm-thick crack preventing layer 104 of silicon-doped n-type In0.05Ga0.95N, a 0.4 μm-thick clad layer 105 of silicon-doped n-type Al0.07Ga0.93N, a 0.1 μm-thick light guide layer 106 of silicon-doped n-type gallium nitride, a multi-quantum well structure active layer 107 of seven periods consisting of 25 Å-thick undoped In0.2Ga0.8N quantum well layers and 50 Å-thick undoped In0.05Ga0.95N barrier layers, a 200 Å-thick indium dissociation preventing layer 108 of magnesium-doped p-type Al0.2Ga0.8N, a 0.1 μm-thick light guide layer 109 of magnesium-doped p-type gallium nitride, a 0.4 μm-thick clad layer 110 of magnesium-doped p-type Al0.07Ga0.93N, a 0.2 μm-thick layer 214 of magnesium-doped p-type gallium nitride, a 2000 Å-thick silicon oxide film 215, a 1.0 μm-thick contact layer 111 of magnesium-doped p-type gallium nitride, a p-electrode 112 formed of nickel (a first layer) and gold (a second layer), and an n-electrode 113 formed of titanium (a first layer) and aluminum (a second layer). All of the semiconductor layers of the prior art nitride-based semiconductor laser shown in FIG. 8 are a hexagonal crystal having a surface of a (0001) plane.

A method for fabricating the prior nitride-based semiconductor laser shown in FIG. 8 will be described. First, on the planar sapphire substrate 201, the low-temperature-grown gallium nitride buffer layer 102, the n-type gallium nitride contact layer 103, the n-type In0.05Ga0.95N crack preventing layer 104, the n-type Al0.07Ga0.93N clad layer 105, the n-type gallium nitride light guide layer 106, the multi-quantum well structure active layer 107, the p-type Al0.2Ga0.8N indium dissociation preventing layer 108, the p-type gallium nitride light guide layer 109, the p-type Al0.07Ga0.93N clad layer 110 and the p-type gallium nitride layer 214, are formed in the named order. Thereafter, the silicon oxide film 215 having openings in the form of a stripe having a width of 5 μm in a orientation of the crystal of the n-type gallium nitride contact layer 103 or the p-type gallium nitride layer 214, is formed by a thermal chemical vapor deposition. Then, by use of a metal organic chemical vapor deposition using ammonia as a V-group material, and by using the thus formed silicon oxide film 215 as a mask, the p-type gallium nitride contact layer 111 is selectively formed in only the opening at a substrate temperature of 1050° C. FIG. 9 is a diagrammatic sectional view when this process has been completed. In the silicon oxide film 215, the stripe-shaped openings having the width of 5 μm are formed with intervals of 900 μm.

The nitride-based semiconductor laser of the prior art 1 shown in FIG. 6 has a problem that an oscillation threshold current is large because it does not have a current narrowing structure and a structure for confining the light in a horizontal direction in parallel to the substrate.

The nitride-based semiconductor laser of the prior art 2 shown in FIG. 7 narrows the current and confines the light in the horizontal direction in parallel to the substrate by means of the ridge structure.

Therefore, the nitride-based semiconductor laser of the prior art 2 shown in FIG. 7 has an advantage that the oscillation threshold current is smaller than that of the nitride-based semiconductor laser of the prior art 1 shown in FIG. 6. However, the ridge structure is formed by means of the dry etching. Therefore, the nitride-based semiconductor laser of the prior art 2 shown in FIG. 7 has a problem that, since a contact area between the p-electrode formed on the semiconductor laser surface and the p-type gallium nitride contact layer 111 is small, a contact resistance of the p-electrode is large, and since the area of the p-type gallium nitride contact layer 111 is small, a bulk resistance of the p-type gallium nitride contact layer 111 is large. In addition, there is another problem that controllability of the etching rate is generally poor in the dry etching, and therefore, the semiconductor layers are liable to be damaged.

The nitride-based semiconductor laser of the prior art 3 shown in FIG. 8 narrows the current and confines the light in the horizontal direction in parallel to the substrate by means of the ridge structure. Therefore, the nitride-based semiconductor laser of the prior art 3 shown in FIG. 8 has an advantage that the oscillation threshold current is smaller than that of the nitride-based semiconductor laser of the prior art 1 shown in FIG. 6. In addition, the ridge structure is formed, by the selective deposition, in parallel to the [1 $\overline{1}$00] orientation of the crystal of the n-type gallium nitride contact layer 103 or the p-type gallium nitride layer 214.

Because of this, in the nitride-based semiconductor laser of the prior art 3 shown in FIG. 8, since the contact area between the p-electrode formed on the semiconductor laser surface and the p-type gallium nitride contact layer 111 is larger than that in the nitride-based semiconductor laser of the prior art 2 shown in FIG. 7, the contact resistance of the p-electrode is small, and since the area of the p-type gallium nitride contact layer 111 is large, the bulk resistance of the p-type gallium nitride contact layer 111 is small. In addition, there is another advantage that controllability of the growth rate in the selective deposition is generally more excellent than the controllability of the etching rate in the dry etching, and therefore, the semiconductor layers are in no way damaged.

In general, however, when the nitride-based semiconductor is deposited by the metal organic chemical vapor deposition, it is necessary to heat the substrate at a temperature which is higher than that when other compound semiconductors are deposited. Therefore, in the method for fabricating the nitride-based semiconductor laser of the prior art 3 shown in FIG. 8, the substrate is heated at 1050° C. in all the steps of crystal-growing the semiconductor layer which does not have the indium as a constituent element, including the step for selectively depositing the p-type gallium nitride contact layer 111 in only the opening of the mask, but excluding the step for forming the low-temperature-grown gallium nitride buffer layer 102. On the other hand, the silicon oxide layer formed by the thermal chemical vapor deposition starts a partial decomposition at a temperature of not less than 800° C. Because of this, a problem is encountered in that, in the course of forming the p-type gallium nitride contact layer 111, the silicon oxide film 215 is retreated so that the opening is enlarged, with the result that it is difficult to control the width of the selectively deposited layer to a desired value.

Furthermore, another problem is encountered in that, the silicon generated by the decomposition of the silicon oxide film 215 is deposited on a re-growth boundary between the p-type gallium nitride layer 214 and the p-type gallium nitride contact layer 111, and also, is included in the p-type gallium nitride contact layer 111. As a result, many crystal defects occurs in the p-type gallium nitride contact layer 111. In addition, since silicon is an n-type impurity against the nitride-based semiconductor, the current-voltage characteristics becomes deteriorated when the device is fabricated by the selective deposition.

In addition, in the method for fabricating the nitride-based semiconductor laser of the prior art 3 shown in FIG. 8, a further problem is encountered in that, since the coverage of the silicon oxide film 215 is as extremely high as 99%, when the p-type gallium nitride contact layer 111 is formed by the selective deposition using the silicon oxide film 215 as a mask, the growth rate of the p-type gallium nitride contact layer 111 is extremely high, controllability of the thickness of the p-type gallium nitride contact layer 111 is poor, and many crystal defects occurs in the p-type gallium nitride contact layer 111.

SUMMARY OF THE INVENTION

Accordingly, it is an object of the present invention to provide a method for depositing the semiconductor layer, which has overcome the above mentioned problems.

A second object of the present invention is to provide a method for depositing the semiconductor layer, with excellent controllability and with giving no damage to the semiconductor layer.

A third object of the present invention is to provide a method for depositing the semiconductor layer, with excellent controllability capable of controlling the width of the selectively deposited layer to a desired value, with no enlargement of the opening of a mask.

A fourth object of the present invention is to provide a method for depositing the semiconductor layer, having less crystal defect.

In order to achieve the above mentioned objects of the present invention, the method in accordance with the present invention for depositing the semiconductor layer, is a sel ctiv d position wherein after a mask having an opening is formed by using a material including an element which makes a semiconductor layer into a first conductivity type, at least one semiconductor layer of a second conductivity type is selectively grown in the opening at a growth temperature which is higher than a temperature where the material of the mask is decomposed, and is characterized in that a portion of constituent elements of the material of the mask is the same as a portion of constituent elements of the semiconductor layer.

The method in accordance with the present invention for depositing a nitride-based semiconductor layer, is a selective deposition in which after a mask having an opening is formed by using a material including an element which makes the nitride-based semiconductor layer into a first conductivity type, at least one nitride-based semiconductor layer of a second conductivity type is selectively grown in the opening at a growth temperature which is higher than a temperature where the material of the mask is decomposed, and is characterized in that a portion of constituent elements of the material of the mask is the same as a portion of constituent elements of the nitride-based semiconductor layer.

The method in accordance with the present invention for depositing a nitride-based semiconductor layer, is a selective deposition in which after a mask having an opening is formed by using a material including an element which makes the nitride-based semiconductor layer into an n type, at least one p-type nitride-based semiconductor layer is selectively grown in the opening at a growth temperature which is higher than a temperature where the material of the mask is decomposed, and is characterized in that the material of the mask includes nitrogen.

The method in accordance with the present invention for depositing a nitride-based semiconductor layer, is a selective deposition in which after a mask having an opening is formed by using a material including an element which makes the nitride-based semiconductor layer into an n type, at least one p-type nitride-based semiconductor layer is selectively grown in the opening at a growth temperature which is higher than a temperature where the material of the mask is decomposed, and is characterized in that the material of the mask is silicon nitride.

The semiconductor layer in accordance with the present invention formed by a selective deposition is a semiconductor layer of a second conductivity type, which is selectively grown in an opening at a growth temperature which is higher than a temperature where a material of a mask is decomposed, after the mask having the opening is formed by using the material including an element which makes a semiconductor layer into a first conductivity type, and is characterized in that a portion of constituent elements of the material of the mask is the same as a portion of constituent elements of the semiconductor layer.

The nitride-based semiconductor layer in accordance with the present invention formed by a selective deposition is a nitride-based semiconductor layer of a second conductivity type, which is selectively grown in an opening at a growth temperature which is higher than a temperature where a material of a mask is decomposed, after the mask having the opening is formed by using the material including an element which makes the nitride-based semiconductor layer into a first conductivity type, and is characterized in that a portion of constituent elements of the material of the mask is the same as a portion of constituent elements of the nitride-based semiconductor layer.

The nitride-based semiconductor layer in accordance with the present invention formed by a selective deposition is a p-type nitride-based semiconductor layer which is selectively grown in an opening at a growth temperature which is higher than a temperature where a material of a mask is decomposed, after the mask having the opening is formed by using the material including an element which makes the nitride-based semiconductor layer into an n type, and is characterized in that the material of the mask includes nitrogen.

The nitride-based semiconductor layer in accordance with the present invention formed by a selective deposition is a p-type nitride-based semiconductor layer which is selectively grown in an opening at a growth temperature which is higher than a temperature where a material of a mask is decomposed, after the mask having the opening is formed by using the material including an element which makes the nitride-based semiconductor layer into an n type, and is characterized in that the material of the mask is silicon nitride.

The method in accordance with the present invention for fabricating a nitride-based semiconductor light emitting device, is characterized by including forming a mask by a material including nitrogen as a constituent element, and by selectively crystal-growing at least one nitride-based semiconductor layer in an opening of the mask, so as to form at least one of a current narrowing structure and a structure confining a light in a horizontal direction in parallel to a substrate.

The method in accordance with the present invention for fabricating a nitride-based semiconductor light emitting device, is characterized by including the step of forming on the substrate at least one layer including at least a nitride-based semiconductor layer of a first conductivity type, at least one nitride-based semiconductor layer including at least an active layer, and at least one nitride-based semiconductor layer including at least a semiconductor layer of a second conductivity type, the step of forming a mask having a stripe-shaped opening by a material including nitrogen as a constituent element, and the step of forming, in the opening of the mask, at least one nitride-based semiconductor layer including at least a nitride-based semiconductor layer of the second conductivity type.

The method in accordance with the present invention for fabricating a nitride-based semiconductor light emitting device, is characterized by including the step of forming on the substrate at least one layer including at least a nitride-based semiconductor layer of a first conductivity type, at least one nitride-based semiconductor layer including at least an active layer, and at least one nitride-based semiconductor layer including at least a nitride-based semiconductor layer of a second conductivity type, the step of forming a mask having a stripe-shaped opening by a material including nitrogen as a constituent element, and the step of selectively crystal-growing, in the opening of the mask, at least one nitride-based semiconductor layer including at least a nitride-based semiconductor layer of the second conductivity type, so as to form at least one of the current narrowing structure and the structure confining a light in a horizontal direction in parallel to a substrate.

The material including nitrogen as the constituent element is silicon nitride. The coverage of the mask is not greater than 50%.

The nitride-based semiconductor light emitting device in accordance with the present invention includes a mask formed of a material including nitrogen as a constituent element, and at least one of a current narrowing structure and a structure confining a light in a horizontal direction in parallel to a substrate, formed by selectively crystal-growing at least one nitride-based semiconductor layer in an opening of the mask.

The nitride-based semiconductor light emitting device in accordance with the present invention includes at least one nitride-based semiconductor layer including at least a nitride-based semiconductor layer of a first conductivity type, at least one nitride-based semiconductor layer including at least an active layer, at least one layer including at least a nitride-based semiconductor layer of a second conductivity type, a mask having a stripe-shaped opening formed by a material including nitrogen as a constituent element, and at least one nitride-based semiconductor layer selectively crystal-grown in the opening of the mask and including at least a nitride-based semiconductor layer of the second conductivity type, the layers being formed on the substrate in order.

The nitride-based semiconductor light emitting device in accordance with the present invention includes at least one layer including at least a nitride-based semiconductor layer of a first conductivity type, at least one nitride-based semiconductor layer including at least an active layer, at least one nitride-based semiconductor layer including at least a nitride-based semiconductor layer of a second conductivity type, a mask having a stripe-shaped opening formed by a material including nitrogen as a constituent element, and at least one nitride-based semiconductor layer selectively crystal-grown in the openings of the mask and including at least a nitride-based semiconductor layer of the second conductivity type, thereby to form at least one of the current narrowing structure and the structure confining the light in the horizontal direction in parallel to the substrate.

The material including nitrogen as the constituent element is silicon nitride. The coverage of the mask is not greater than 50%.

In particular, it is preferred that the crystal structure of the semiconductor on which the mask is formed is a hexagonal crystal and has a surface which is of (0001) plane or has an angle of not greater 10° to the (0001) plane, and that a stripe direction of the mask is in a [1100] direction of the semiconductor crystal or in a direction having an angle of not greater than 10°, against the [1$\bar{1}$00] direction.

Furthermore, it is preferred that the first conductivity type is the n-type and the second conductivity type is the p-type. The semiconductor layer including the nitrogen as the constituent element is characterized to be expressed by a general formula $In_xAl_yGa_{1-x-y}N$ ($0 \leq x \leq 1$, $0 \leq y \leq 1$, $0 \leq x+y \leq 1$).

DESCRIPTION OF THE PREFERRED EMBODIMENTS

Now, embodiments of the present invention will be described in detail with reference to the drawings.
Embodiment 1

In an embodiment 1 which is one embodiment of the present invention, the ridge structure of the nitride-based semiconductor laser is formed by the selective deposition using a silicon nitride film as a mask.

Figure 1:
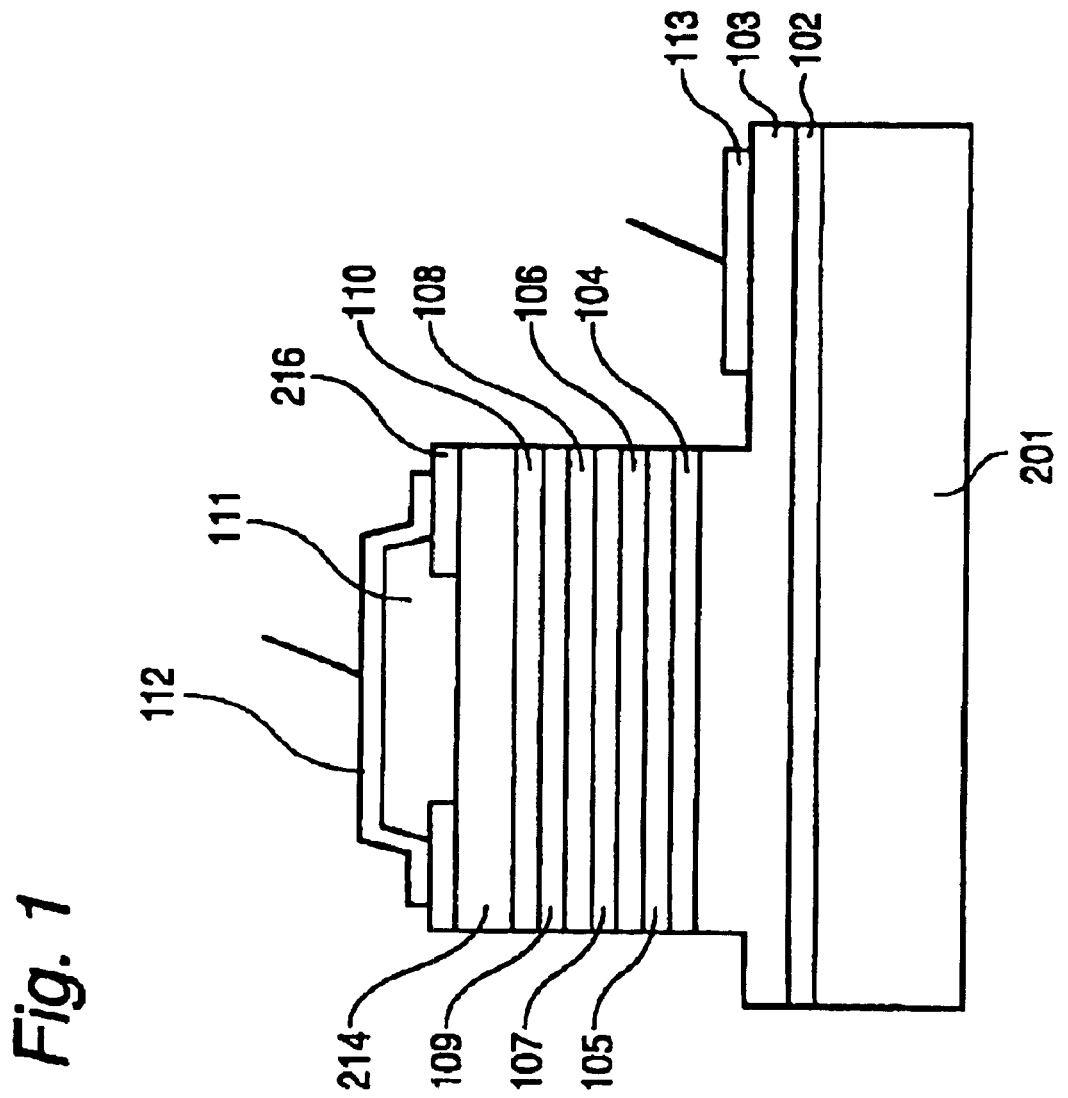
FIG. 1 is a diagrammatic section view of the nitride-based semiconductor laser fabricated by using the fabricating method in accordance with the present invention, shown in an embodiment 1.

FIG. 1 is a diagrammatic section view of the nitride-based semiconductor laser fabricated by using the fabricating method in accordance with the present invention. Now, the structure of the nitride-based semiconductor laser which is the embodiment 1 shown in FIG. 1 will be described. On a sapphire substrate 201 having a principal surface of a (11$\bar{2}$0) plane, there are formed a 300 Å-thick undoped low-temperature-grown gallium nitride buffer layer 102, a 3 μm-thick contact layer 103 of silicon-doped n-type gallium nitride, a 0.1 μm-thick crack preventing layer 104 of silicon-doped n-type $In_{0.05}Ga_{0.95}N$, a 0.4 μm-thick clad layer 105 of silicon-doped n-type $Al_{0.07}Ga_{0.93}N$, a 0.1 μm-thick light guide layer 106 of silicon-doped n-type gallium nitride, a multi-quantum well structure active layer 107 of seven periods consisting of 25 Å-thick undoped $In_{0.2}Ga_{0.5}N$ quantum well layers and 50 Å-thick undoped $In_{0.05}Ga_{0.95}N$ barrier layers, a 200 Å-thick indium dissociation preventing layer 108 of magnesium-doped p-type $Al_{0.2}Ga_{0.8}N$, a 0.1 μm-thick light guide layer 109 of magnesium-doped p-type gallium nitride, a 0.4 μm-thick clad layer 110 of magnesium-doped p-type $Al_{0.07}Ga_{0.93}N$, a 0.2 μm-thick layer 214 of magnesium-doped p-type gallium nitride, a 3000 Å-thick silicon oxide film 215, a 1.0 μm-thick contact layer 111 of magnesium-doped p-type gallium nitride, a p-electrode 112 formed of nickel (a first layer) and gold (a second layer), and an n-electrode 113 formed of titanium (a first layer) and aluminum (a second layer). All of the nitride-based semiconductor layers of the nitride-based semiconductor laser of the embodiment 1 shown in FIG. 1 are a hexagonal crystal having a surface of a (0001) plane.

Figure 2:
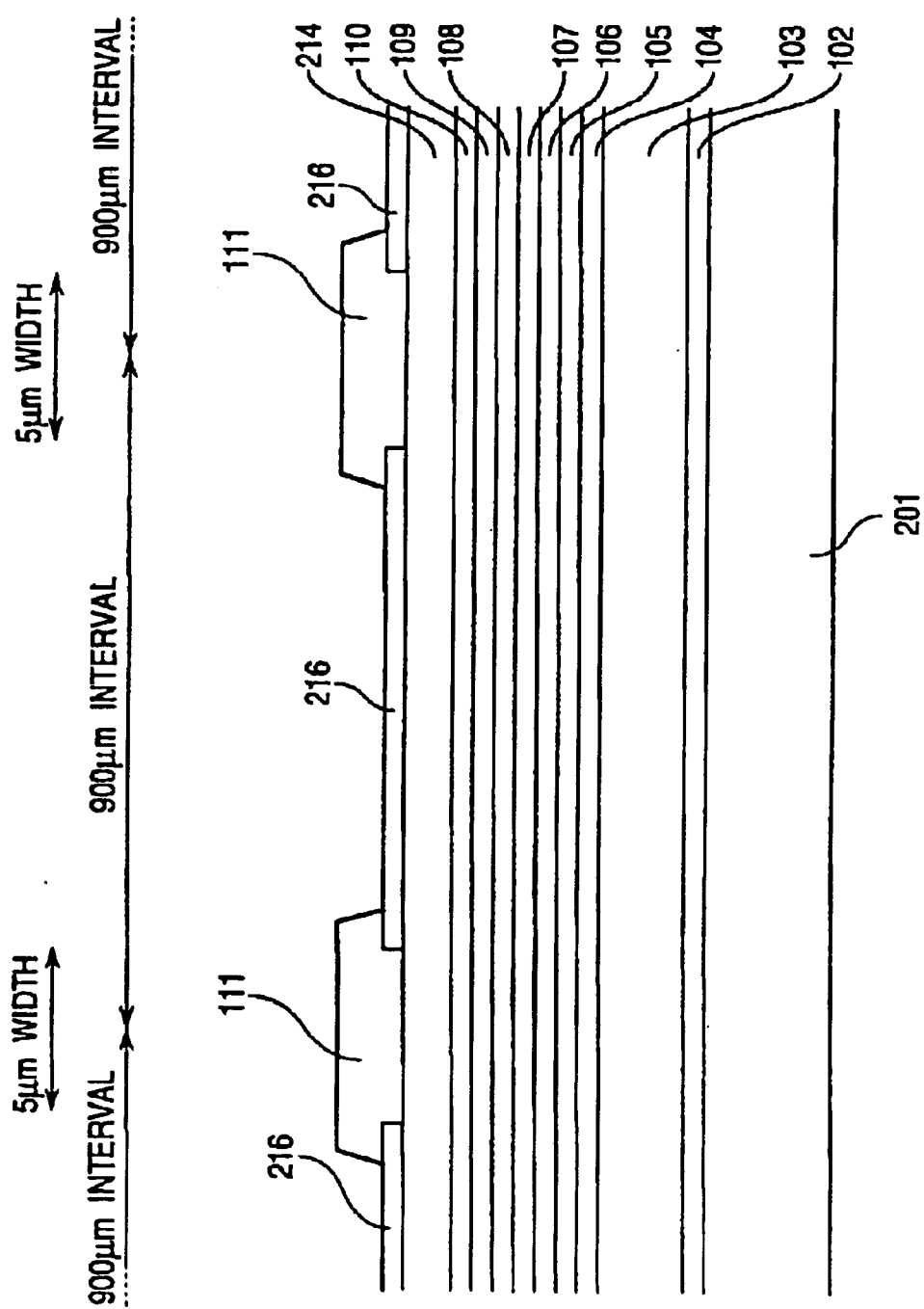
FIG. 2 is a diagrammatic section view for illustrating a midway step of the fabricating method for fabricating the nitride-based semiconductor layer, shown in the embodiment 1.

Next, the method for fabricating the nitride-based semiconductor laser of the embodiment 1 shown in FIG. 1 will be described with reference to FIG. 2. FIG. 2 is a diagrammatic section view for illustrating one step of the fabricating method for fabricating the nitride-based semiconductor layer of the embodiment 1 shown in FIG. 1. First, by use of a metal organic chemical vapor deposition using ammonia as a V-group material, on the planar sapphire substrate 201, the low-temperature-grown gallium nitride buffer layer 102, the n-type gallium nitride contact layer 103, the n-type $In_{0.05}Ga_{0.95}N$ crack preventing layer 104, the n-type $Al_{0.07}Ga_{0.93}N$ clad layer 105, the n-type gallium nitride light guide layer 106, the multi-quantum well structure active layer 107, the p-type $Al_{0.2}Ga_{0.5}N$ indium dissociation preventing layer 108, the p-type gallium nitride light guide layer 109, the p-type $Al_{0.07}Ga_{0.93}N$ clad layer 110 and the p-type gallium nitride layer 214, are sequentially formed. Thereafter, the silicon nitride film 216 having 5 μm-width stripe-shaped openings, in a [1$\bar{1}$00] orientation of the crystal of the n-type gallium nitride contact layer 103 or the p-type gallium nitride layer 214, and located with intervals of 900 μm, is formed by a plasma chemical vapor deposition.

Ordinarily, when the silicon nitride film is formed, silane ($SiH_4$) and ammonia ($NH_3$) are used as a stating material. In order to thermally decompose the ammonia ($NH_3$), a high temperature on the order of not less than 1000° C. is required, and it is not so easy to control the film deposition at such a high temperature. Therefore, in the embodiment 1, when the silicon nitride film is formed, the plasma chemical vapor deposition is used, in which the substrate temperature at the film depositing time is restricted to a relatively low temperature on the order of 200° C. to 250° C., and the ammonia ($NH_3$) is decomposed by use of a plasma generated by a high frequency.

Thereafter, by means of the metal organic chemical vapor deposition using the ammonia as a V-group material, and by using the silicon nitride film 216 as the mask, the p-type gallium nitride contact layer 111 is selectively deposited in only the opening at the substrate temperature of 1050° C. FIG. 2 is a diagrammatic sectional view after this step has been completed.

Here, explanation will be made on the ground for the fact that the opening of the mask of the silicon nitride film 216 is not enlarged, many crystal defects do not occurs in the selectively deposited p-type gallium nitride contact layer 111, and the current-voltage characteristics of the device is not deteriorated. Ordinarily, the silicon nitride film formed by the plasma chemical vapor deposition starts to partially decompose at a temperature of not less than 800° C., similarly to the silicon oxide film formed by the thermal chemical vapor deposition. However, in the method for fabricating the nitride-based semiconductor laser of the embodiment 1 shown in FIG. 1, when the p-type gallium nitride contact layer 111 is selectively deposited by using the silicon nitride film 216 as the mask, since the ammonia ($NH_3$) is supplied as the V-group material for the p-type gallium nitride contact layer 111, the ammonia ($NH_3$) is decomposed in the ammonia ($NH_3$) atmosphere of the temperature of not less than 1000° C., so that a partial pressure of the nitrogen gas in a gas phase exceeds a certain degree. Therefore, separation of the nitrogen from the silicon nitride (SiN) film becomes balanced with absorption of the nitrogen to the silicon nitride (SiN) film, with the result that, the decomposition of the silicon nitride film 216 is suppressed although the p-type gallium nitride contact layer 111 is deposited at as a high temperature as 1050° C. Therefore, the silicon nitride film 216 is prevented from being retreated and the opening is prevented from being enlarged.

Thus, the silicon generated by the decomposition of the silicon nitride 216 is prevented from being deposited on the re-growth boundary between the p-type gallium nitride layer 214 and the p-type gallium nitride contact layer 111, so that the silicon is in no way taken into the p-type gallium nitride contact layer 111.

Figure 5:
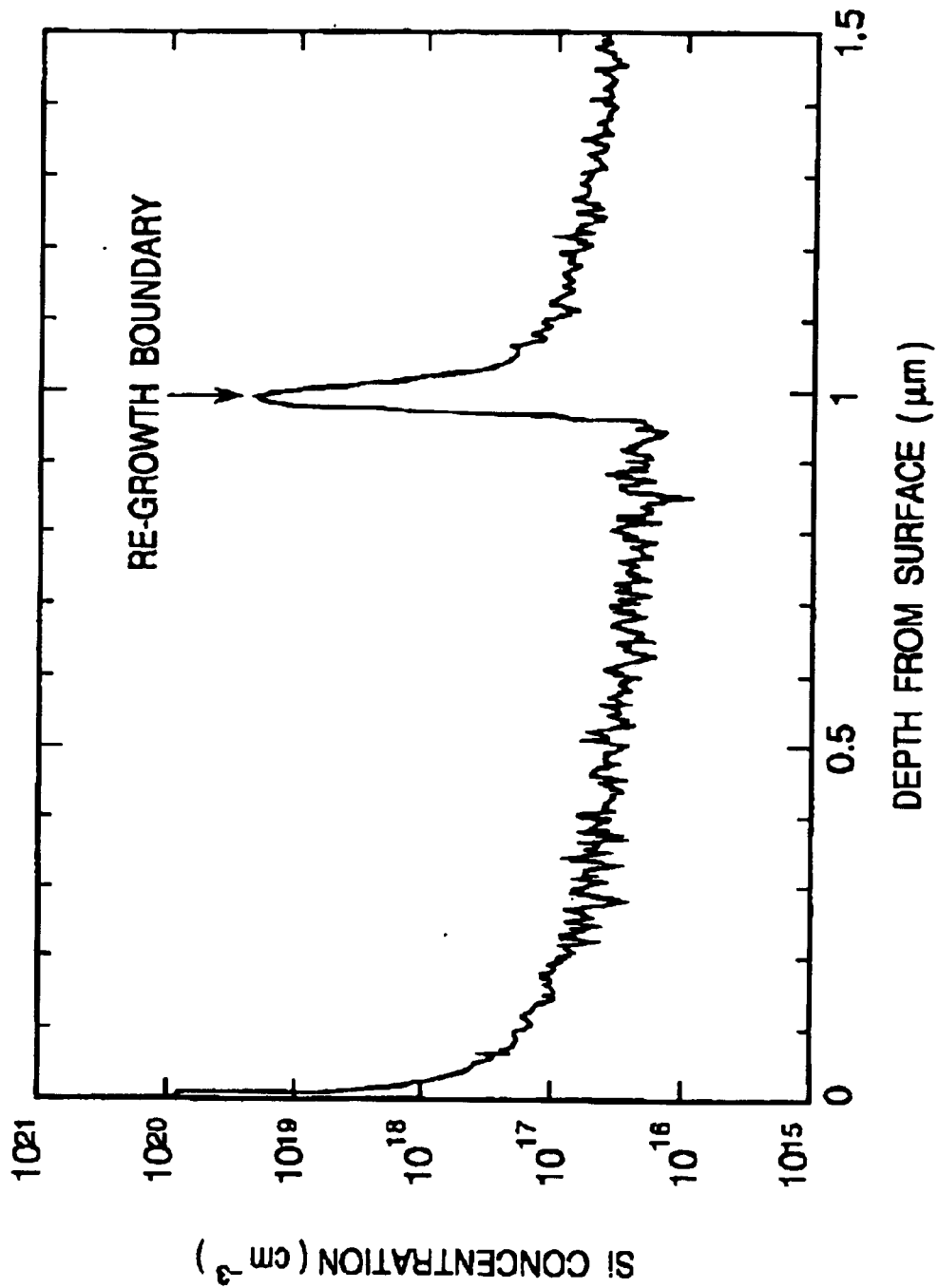
FIG. 5 is a graph showing the result of a secondary ion mass spectrometry analysis of the nitride-based semiconductor layer shown in the embodiment 1.
Figure 6:
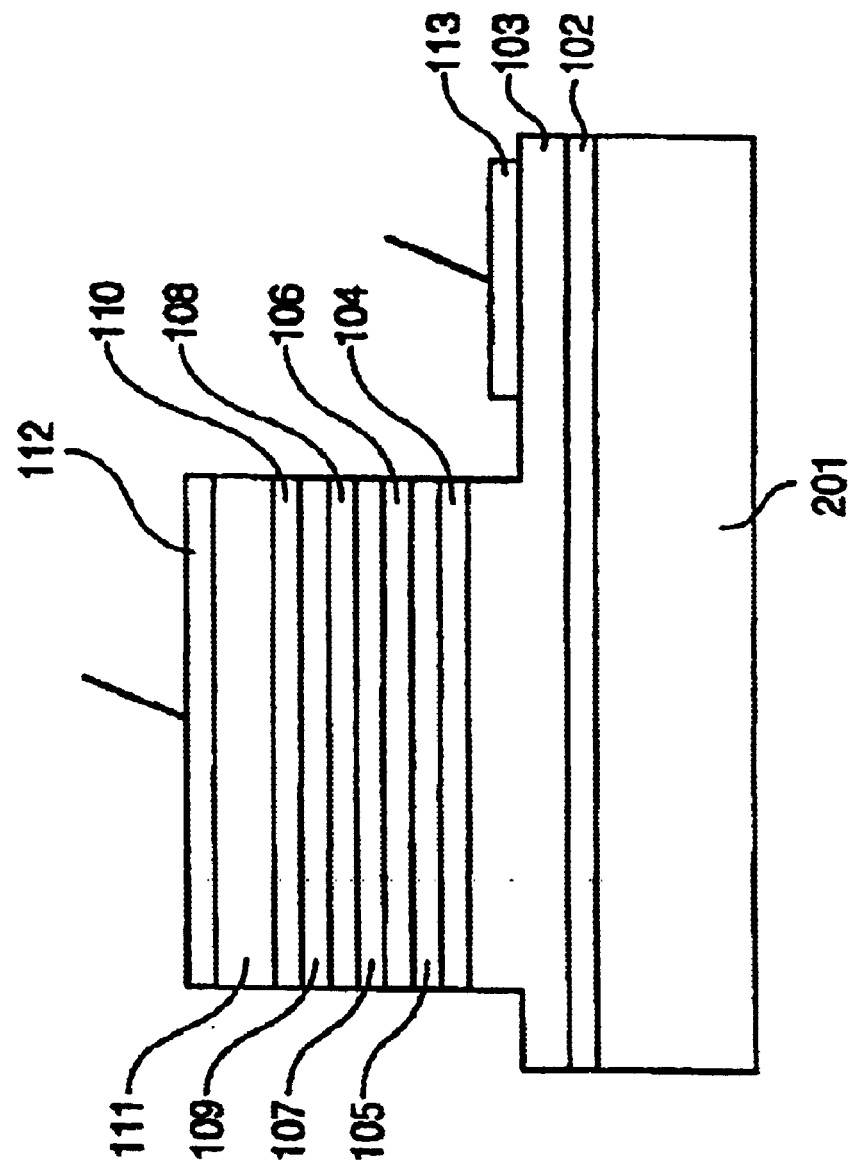
FIG. 6 is a diagrammatic section view of the nitride-based semiconductor layer shown in the prior art example 1.
Figure 7:
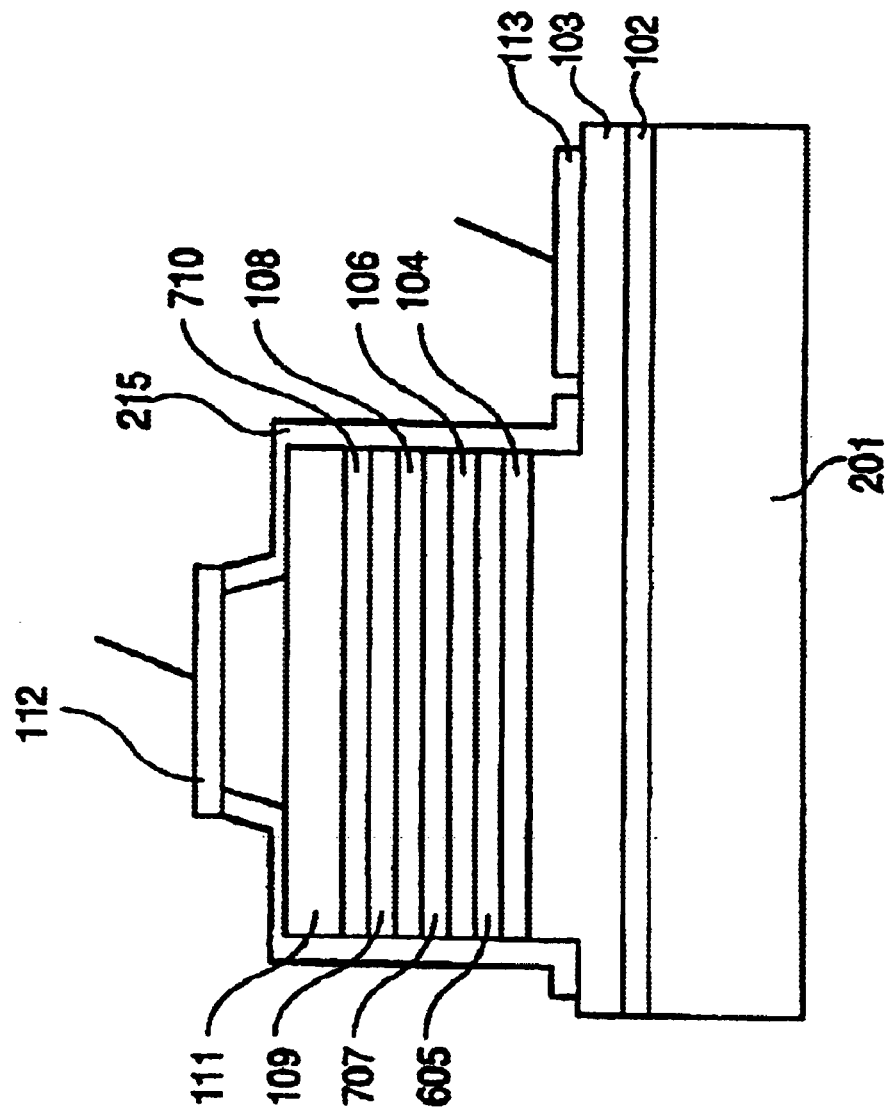
FIG. 7 is a diagrammatic section view of the nitride-based semiconductor layer shown in the prior art example 2.
Figure 8:
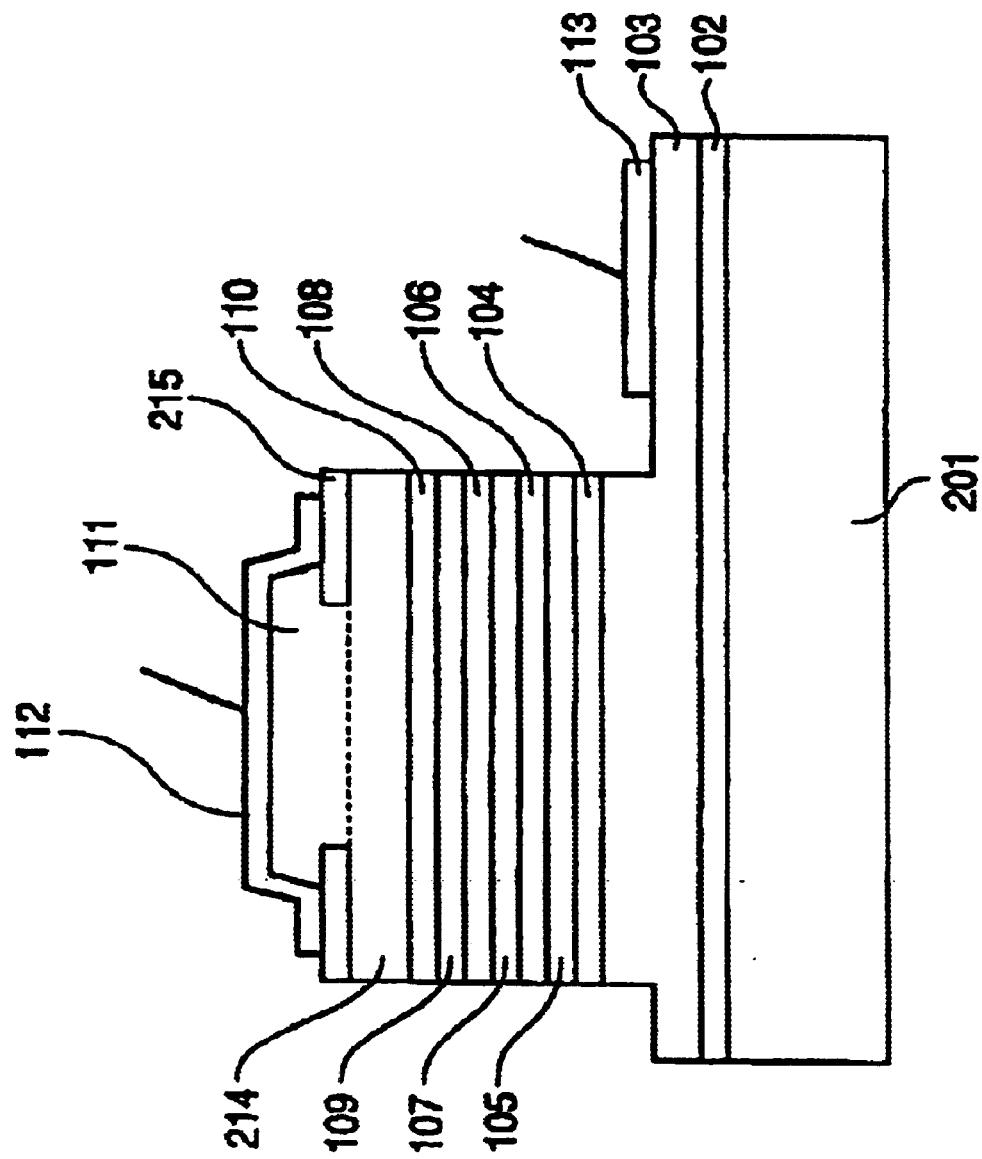
FIG. 8 is a diagrammatic section view of the nitride-based semiconductor layer shown in the prior art example 3.
Figure 9:
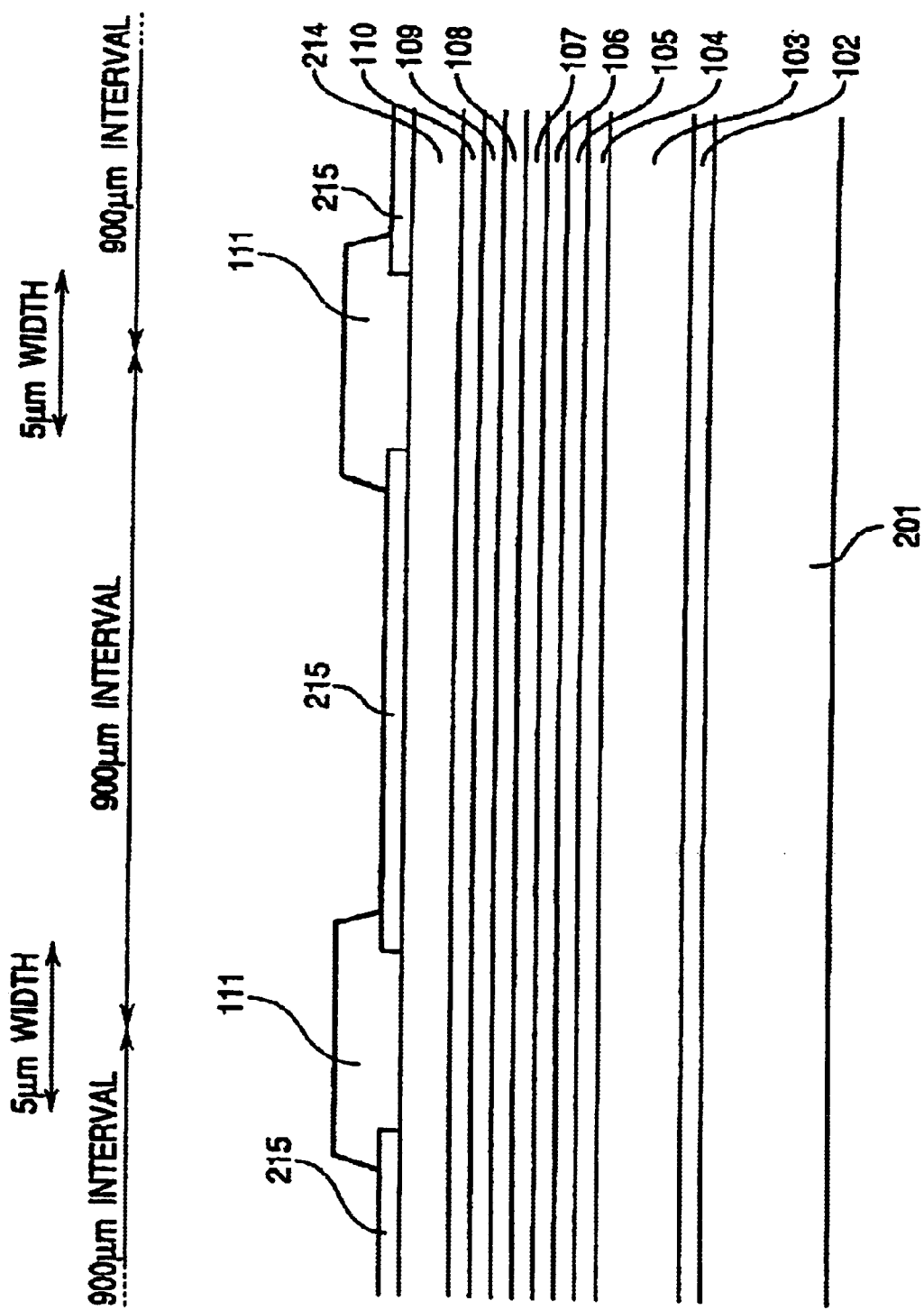
FIG. 9 is a diagrammatic section view for illustrating a midway step of the method for fabricating the nitride-based semiconductor layer shown in the prior art example 3.

FIG. 5 is a graph showing the result of a secondary ion mass spectrometry analysis of the nitride-based semiconductor layer shown in FIG. 1 and fabricated in accordance with the fabricating method of the embodiment 1. In the embodiment 1, the deposition of the silicon on the re-growth boundary is not found out. Therefore, many crystal defects do not occur in the p-type gallium nitride contact layer 111, and the current-voltage characteristics of the device is not deteriorated.

Embodiment 2

In an embodiment 2 which is one embodiment of the present invention, the ridge structure of the nitride-based semiconductor laser is formed by the selective deposition using as a mask a silicon nitride film having a small coverage.

Figure 3:
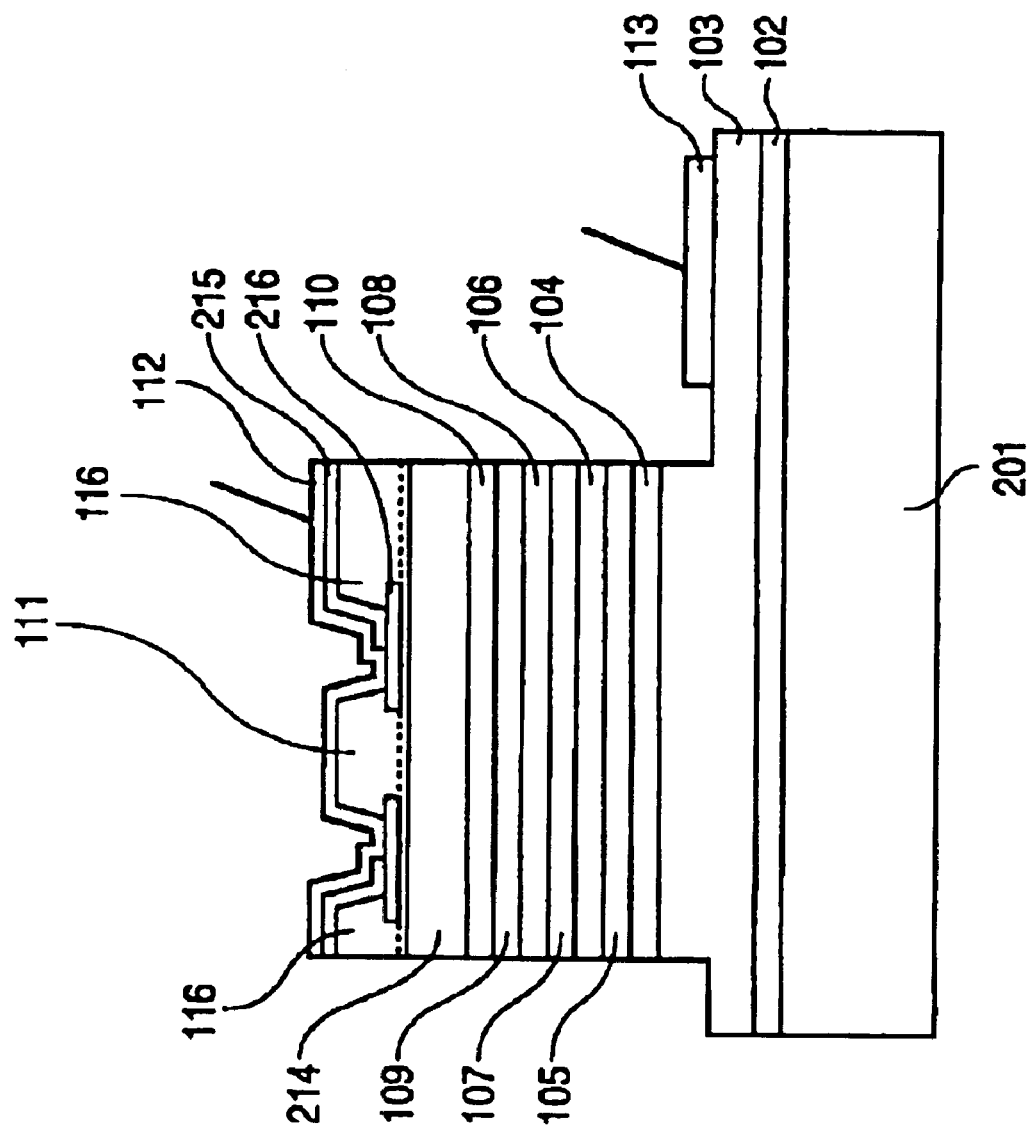
FIG. 3 is a diagrammatic section view of the nitride-based semiconductor laser fabricated by using the fabricating method in accordance with the present invention, shown in an embodiment 2.

FIG. 3 is a diagrammatic section view of the nitride-based semiconductor laser fabricated by using the fabricating method in accordance with the present invention. Now, the structure of the nitride-based semiconductor laser which is the embodiment 2 shown in FIG. 3 will be described. On a sapphire substrate 201 having a principal surface of a (11$\bar{2}$0) plane, there are formed a 300 Å-thick undoped low-temperature-grown gallium nitride buffer layer 102, a 3 μm-thick contact layer 103 of silicon-doped n-type gallium nitride, a 0.1 μm-thick crack preventing layer 104 of silicon-doped n-type $In_{0.05}Ga_{0.95}N$, a 0.4 μm-thick clad layer 105 of silicon-doped n-type $Al_{0.07}Ga_{0.93}N$, a 0.1 μm-thick light guide layer 106 of silicon-doped n-type gallium nitride, a multi-quantum well structure active layer 107 of seven periods consisting of 25 Å-thick undoped $In_{0.2}Ga_{0.8}N$ quantum well layers and 50 Å-thick undoped $In_{0.05}Ga_{0.95}N$ barrier layers, a 200 Å-thick indium dissociation preventing layer 108 of magnesium-doped p-type $Al_{0.2}Ga_{0.8}N$, a 0.1 μm-thick light guide layer 109 of magnesium-doped p-type gallium nitride, a 0.4 μm-thick clad layer 110 of magnesium-doped p-type $Al_{0.07}Ga_{0.93}N$, a 0.2 μm-thick layer 214 of magnesium-doped p-type gallium nitride, a 2000 Å-thick silicon nitride layer 216, a 1.0 μm-thick contact layer 111 of magnesium-doped p-type gallium nitride, a 1.0 μm-thick layer 116 of magnesium-doped p-type gallium nitride, a 2000 Å-thick silicon oxide film 215, a p-electrode 112 formed of nickel (a first layer) and gold (a second layer), and an n-electrode 113 formed of titanium (a first layer) and aluminum (a second layer). All of the nitride-based semiconductor layers of the nitride-based semiconductor laser of the embodiment of the present invention shown in FIG. 3 are a hexagonal crystal having a surface of a (0001) plane.

Figure 4:
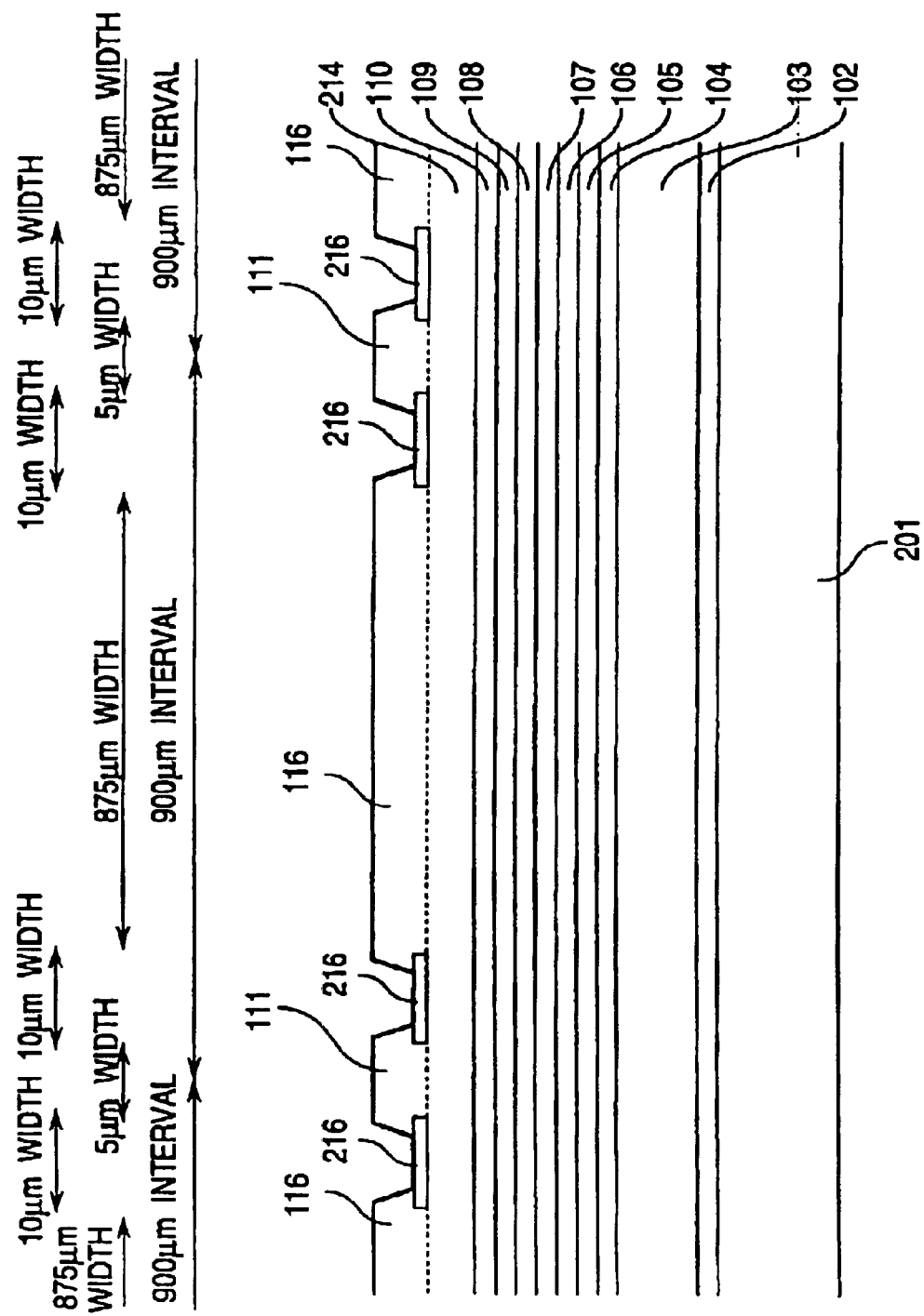
FIG. 4 is a diagrammatic section view for illustrating a midway step of the fabricating method for fabricating the nitride-based semiconductor layer, shown in the embodiment 2.

Next, the method for fabricating the nitride-based semiconductor laser of the embodiment 2 shown in FIG. 3 will be described with reference to FIG. 4. FIG. 4 is a diagrammatic section view for illustrating one step of the fabricating process for fabricating the nitride-based semiconductor layer of the embodiment 2. First, by use of a metal organic chemical vapor deposition using ammonia as a V-group material, on the planar sapphire substrate 201, the low-temperature-grown gallium nitride buffer layer 102, the n-type gallium nitride contact layer 103, the n-type $In_{0.05}Ga_{0.95}N$ crack preventing layer 104, the n-type $Al_{0.07}Ga_{0.93}N$ clad layer 105, the n-type gallium nitride light guide layer 106, the multi-quantum well structure active layer 107, the p-type $Al_{0.2}Ga_{0.8}N$ indium dissociation preventing layer 108, the p-type gallium nitride light guide layer 109, the p-type $Al_{0.07}Ga_{0.93}N$ clad layer 110 and the p-type gallium nitride layer 214, are formed in order. Thereafter, the silicon nitride film 216 having stripe-shaped openings having a width of 5 μm, in a [1$\bar{1}$00] orientation of the crystal of the n-type gallium nitride contact layer 103 or the p-type gallium nitride layer 214, and located with intervals of 900 μm, and having 875 μm-width dummy openings between the 5 μm-width stripe-shaped openings, is formed by a plasma chemical vapor deposition.

In the embodiment 2, when the silicon nitride film is formed, the plasma chemical vapor deposition is used, in which the substrate temperature at the film depositing time is restricted to a relatively low temperature on the order of 200° C. to 250° C. and the ammonia ($NH_3$) is decomposed by use of a plasma generated by a high frequency.

Thereafter, by means of the metal organic chemical vapor deposition using the ammonia as a V-group material, and by using the silicon nitride film 216 as the mask, the p-type gallium nitride contact layer 111 and the dummy p-type gallium nitride layer 116 are selectively deposited in only the openings at the substrate temperature of 1050° C. FIG. 4 is a diagrammatic sectional view after this step has been completed.

When the p-type gallium nitride contact layer 111 is formed by the selective deposition using the silicon nitride film 216 as the mask, the dummy p-type gallium nitride layer 116 is formed in the 875 μm-width stripe-shaped dummy openings which were formed for lowering the coverage of the silicon nitride film 216. Therefore, in order to prevent a current from flowing through the dummy p-type gallium nitride layer 116, it is necessary to cover the dummy p-type gallium nitride layer 116 with an insulator film.

In the nitride-based semiconductor laser of the embodiment 2 shown in FIG. 3, the silicon oxide film 215 is used as the insulator film. In this case, in order to contact the p-electrode 112 with the p-type gallium nitride contact layer 111, an opening is formed in the silicon oxide film on only the p-type gallium nitride contact layer 111. The silicon oxide film can be easily removed by a wet etching using hydrofluoric acid as an etching liquid. At this time, however, it is necessary to pay attention so that the selective deposition mask 216 is never simultaneously removed. Generally, since the silicon nitride film formed by the plasma chemical vapor deposition has an etching rate to the hydrofluoric acid, lower than that of the silicon oxide film formed by the thermal chemical vapor deposition, when the silicon nitride film is used as the selective deposition mask 216, the step for forming the opening the silicon oxide film 215 advantageously becomes easy.

Here, explanation will be made on the ground for the fact that, in the embodiment 2, when the p-type gallium nitride contact layer 111 is formed by the selective deposition using the silicon nitride film 216 as the mask, the growth rate of the p-type gallium nitride contact layer 111 is never extremely high, so that the controllability of the thickness of the p-type gallium nitride contact layer 111 is excellent, and crystal defects in the p-type gallium nitride contact layer 111 are minimized.

In the selective deposition, of materials supplied to a sample surface having a semiconductor layer partially covered with a mask, the material reaching the mask is moved into the opening of the mask, because of the migration on the mask and/or a diffusion in a gas phase. Therefore, the amount of material supplied to the mask opening is larger than that when the whole surface deposition is carried out with no mask under the same condition, with the result that the deposition rate becomes high. This increase of the deposition rate substantially corresponds to a value obtained by multiplying the deposition rate of the whole surface deposition by the reciprocal of the coverage. Therefore, when the coverage is high, the deposition rate becomes extremely high.

In the method for fabricating the nitride-based semiconductor laser of the embodiment 2 shown in FIG. 3, since the coverage of the silicon nitride film 216 is as extremely low as 2%, when the p-type gallium nitride contact layer 111 is formed by the selective deposition using the silicon nitride film 216 as the mask, the growth rate of the p-type gallium nitride contact layer 111 never becomes extremely high, differently from the method for fabricating the nitride-based semiconductor laser of the embodiment 1 shown in FIG. 1, so that the controllability of the thickness of the p-type gallium nitride contact layer 111 is excellent, and crystal defects in the p-type gallium nitride contact layer 111 are minimized.

As mentioned above, in this embodiment, since the current narrowing and the light confining in the horizontal direction in parallel to the substrate are realized by the ridge structure, the oscillation threshold current can be made small. In addition, the ridge structure is formed in parallel to the [1$\bar{1}$00] direction of the crystal of the n-type gallium nitride contact layer or the p-type gallium nitride layer. Therefore, the contact area between the p-type gallium nitride contact layer and the p-electrode formed on the surface of the semiconductor laser is large, so that the contact resistance of the p-electrode is small. In addition, since the area of the p-type gallium nitride contact layer is large, the bulk resistance of the p-type gallium nitride contact layer can be made small. Furthermore, the dry etching for forming the current narrowing structure and the structure confining the light in the horizontal direction in parallel to the substrate, is no longer necessary. In addition to the above mentioned advantages, there is an advantage in which the opening of the mask of the silicon nitride film is in no way enlarged, many crystal defects do not occur in the selectively deposited p-type gallium nitride contact layer, and the current-voltage characteristics of the device is not deteriorated.

Moreover, in the embodiment 2, when the p-type gallium nitride contact layer is formed by the selective deposition using the silicon nitride film as the mask, the growth rate of the p-type gallium nitride contact layer never becomes extremely high, so that the controllability of the thickness of the p-type gallium nitride contact layer 111 is excellent, and crystal defects in the p-type gallium nitride contact layer are minimized.

Modifications of Embodiments

Modifications of the nitride-based semiconductor lasers of the embodiment 1 and the embodiment 2 mentioned above will be described.

As regards the structure of the nitride-based semiconductor lasers: The structure of the nitride-based semiconductor lasers is not limited to the nitride-based semiconductor lasers having the structures shown in the embodiments. The present invention can be realized with no trouble in nitride-based semiconductor lasers having various combinations in connection with the film thickness of the respective layers, the composition of the respective layers, the doping concentration of the respective layers, the electrode material, the mask material, the dry etching depth, and the stripe width, and others. In addition, the nitride-based semiconductor having the ridge structure formed by the selective deposition and the fabricating method therefore, have been described, but the prevent invention is not limited to these. The present invention is effective in any nitride-based semiconductor obtained by forming either or both of the current narrowing structure and the light confining structure in the horizontal direction in parallel to the substrate, and in the fabricating method therefore.

As regards the direction of the light guide: In the embodiments, the light guide is formed in the [1$\bar{1}$00] direction of the semiconductor crystal. However, if the light guide is formed in the [1$\bar{1}$00] direction of the semiconductor crystal or in a direction having an angle of not greater than 10° against the [1$\bar{1}$00] direction, the present invention has no trouble. When the light guide is formed in the direction having an angle of not greater than 10° against the [1$\bar{1}$00] direction of the semiconductor crystal, the present invention has no trouble other than the reduction of the contact area of the p-electrode 112.

As regards the substrate on which the nitride-based semiconductor layers are deposited: In the embodiments, the nitride-based semiconductor layers are deposited on the sapphire substrate having the principal surface of the (0001) plane. However, the nitride-based semiconductor layers can be deposited on a sapphire substrate having a principal surface of the (11$\bar{2}$0) plane or a sapphire substrate having a principal surface of a plane other than the (0001) plane and the (11$\bar{2}$0) plane. Furthermore, the present invention can be executed with no trouble when the nitride-based semiconductor layers are deposited on another substrate such as a silicon carbide substrate, a $MgAl_2O_4$ substrate or a gallium nitride substrate.

As regards the plane of the nitride semiconductor layers: In each of the embodiments, the plane of the surface of the nitride semiconductor layers is the (0001) plane. However, if the plane of the surface of the nitride semiconductor layers is the (0001) plane or a plane having an angle of not greater than 10° against the (0001) plane, the present invention can be realized with no trouble.

As regards the mask for the selective deposition: In the embodiments, the mask for the selective deposition is formed of silicon nitride film, the present invention is effective when another film containing nitrogen as a constituent element, for example, an SiNO film is used as the mask for the selective deposition. However, for example, if the SiNO film is used as the mask for the selective deposition, there may be possibility that when the selective deposition is carried out at a high substrate temperature, even if ammonia is used as the V-group material, it is not possible to satisfactorily suppress the decomposition of the mask for the selective deposition. In the present invention, therefore, it is most preferred to use the silicon nitride film as the mask for the selective deposition.

As regards the coverage: In the embodiment 2, the coverage of the silicon nitride film 216 constituting the mask for the selective deposition was 2%. However, the present invention is effective if the coverage of the mask for the selective deposition is not greater than 50%. The reason for this is that if the coverage is not greater than 50%, it is possible to satisfactorily control the thickness of the semiconductor layer formed by the selective deposition, and crystal defects introduced in the nitride-based semiconductor layer are not many. However, the lower the coverage of the mask for the selective deposition is, the higher the controllability of the thickness of the semiconductor layer formed by the selective deposition is, and the fewer the crystal defects introduced in the nitride-based semiconductor layer are. Therefore, the coverage of the mask for the selective deposition is preferred to be as low as possible in the extent allowed in the structure of the device.

As regards the mixed crystal of the nitride-based semiconductor layer: In the embodiments, all the nitride-based semiconductor layers are formed of the material expressed by a general formula $In_xAl_yGa_{1-x-y}N$ ($0 \leq x \leq 1$, $0 \leq y \leq 1$, $0 \leq x+y \leq 1$). For example, when nitride-based semiconductor layers are formed of the material expressed by a general formula $Ga_xIn_{1-x}N_yAs_{1-y}$ ($0 \leq x \leq 1$, $0 \leq y \leq 1$), the present invention is effective. However, when $Ga_xIn_{1-x}N_yAs_{1-y}$ ($0 \leq x \leq 1$, $0 \leq y \leq 1$) layers are formed by the selective deposition, since the supply amount of ammonia is determined by a desired composition ratio between arsenic and nitrogen, the supply amount of ammonia is smaller than that when the $In_xAl_yGa_{1-x-y}N$ ($0 \leq x \leq 1$, $0 \leq y \leq 1$, $0 \leq x+y \leq 1$) layers are formed by the selective deposition. Therefore, when the selective deposition is carried out at a high substrate temperature, there is possibility that it is not possible to satisfactorily suppress the decomposition of the mask for the selective deposition, having the nitrogen as the constituent element. Therefore, the present invention is the most effective when the semiconductor layers having only the nitrogen as the V-group constituent element, for example, the $In_xAl_yGa_{1-x-y}N$ ($0 \leq x \leq 1$, $0 \leq y \leq 1$, $0 \leq x+y \leq 1$) layers are formed by the selective deposition.

As regards the conductivity type of each layer in the nitride-based semiconductor laser: In the embodiments, the nitride-based semiconductor laser in which the substrate side nitride-based semiconductor layers formed by the crystal growth are of n type, and the surface side nitride-based semiconductor layers are of p type, and the fabricating method therefore, have been described. However, the present invention is effective even if the substrate side nitride-based semiconductor layers are of p type, and the surface side nitride-based semiconductor layers arm of n type. However, since the resistivity of the p-type nitride-based semiconductor is as relatively high as 1 Ω·cm, when a non-conductive substrate such as the sapphire substrate is used, it is preferable that the substrate side nitride-based semiconductor layers formed by the crystal growth are of n type, and the surface side nitride-based semiconductor layers are of p type, in order to reduce the resistance of the device.

As regards the deposition method for the silicon nitride film: In the embodiments, the silicon nitride film is formed by the plasma chemical vapor deposition, but a deposition method other than the plasma chemical vapor deposition can be used if another nitrogen material, such as hydrazine ($N_2H_4$) and dimethyl hydrazine ($N_2H_2(CH_3)_2$), which is decomposed at a relatively low temperature.

As regards a selectively deposited layer other than the nitride-based semiconductor layer: In the embodiments, the selective deposition of the nitride-based semiconductor layer has been described, but the selectively deposited layer is not limited to the nitride-based semiconductor layer. It is sufficient if there is an element which is included not only in the elements constituting a layer grown by the selective deposition but also in the elements constituting the mask for the selective deposition.

Preferably, the material of the mask for the selective deposition is constituted of one element which is the same as any of the elements included in the selectively deposited layer and another element as SiN shown in the embodiments 1 and 2.

As regards the other device to which the present invention can be applied: In the embodiments, the nitride-based semiconductor laser and the fabricating method therefore have been described. The present invention is not limited to these device and method. The present invention can be applied to any device which can be formed using the selective deposition, for example, a light emitting diode, a surface emitting device, and a fabricating method therefore.

According to the fabricating method in accordance with the present invention, even if the growth temperature of the layer which is selectively deposited in only the opening of the mask is the temperature where the mask for the selective deposition is generally partially decomposed, the opening of the mask is in no way enlarged.

Accordingly, it is possible to prevent the elements generated by the composition of the mask for the selective deposition, from being deposited on the re-growth boundary of the selectively deposited layer, and from being taken in the selectively deposited layer. Therefore, many crystal defects do not occur in the selectively deposited layer, and the device thus fabricated has a good current-voltage characteristics.

Furthermore, when the layer is formed by the selective deposition, the deposition rate never becomes extremely high, so that a good controllability of the thickness of the selectively deposited layer can be obtained, and the crystal defects can be minimized.

What is claimed is:

1. A method for fabricating a nitride-based semiconductor light emitting device, including:
   forming at least a first nitride-based semiconductor layer, including an active layer of said nitride-based semiconductor light emitting device; and
   forming a current narrowing structure on said at least a first nitride-based semiconductor layer, comprising:
      forming, on said at least a first nitride-based semiconductor layer, a mask of a material including nitrogen as a constituent element, and then
      selectively crystal-growing at least a second nitride-based semiconductor layer in an opening of said mask.

2. A method for fabricating a nitride-based semiconductor light emitting device, claimed in claim 1 wherein said material including nitrogen as the constituent element is silicon nitride.

3. A method for fabricating a nitride-based semiconductor light emitting device, claimed in claim 2 wherein the coverage of said mask is not greater than 50%.

4. A method for fabricating a nitride-based semiconductor light emitting device, claimed in claim 1, the step of forming at least a first nitride-based semiconductor layer comprising:
   forming on a substrate at least a nitride-based semiconductor layer of a first conductivity type,
   forming at least one nitride-based semiconductor layer including at least said active layer, and
   forming at least one nitride-based semiconductor layer of a second conductivity type,
   wherein the opening in said mask is stripe-shaped, and said at least a second nitride-based semiconductor layer includes a nitride-based semiconductor layer of the second conductivity type.

5. A method for fabricating a nitride-based semiconductor light emitting device, claimed in claim 4 wherein said material including nitrogen as the constituent element is silicon nitride.

6. A method for fabricating a nitride-based semiconductor light emitting device, claimed in claim 5 wherein the coverage of said mask is not greater than 50%.

7. A method for fabricating a nitride-based semiconductor light emitting device, including:
   forming at least a first nitride-based semiconductor layer, including an active layer of said nitride-based semiconductor light emitting device; and
   forming a structure on said at least a first nitride-based semiconductor layer, said structure confining light of said nitride-based semiconductor light emitting device in a horizontal direction in parallel to a substrate, comprising:
      forming, on said at least a first nitride-based semiconductor layer, a mask of a material including nitrogen as a constituent element, and then
      selectively crystal-growing at least a second nitride-based semiconductor layer in an opening of said mask.

8. A method for fabricating a nitride-based semiconductor light emitting device, claimed in claim 7 wherein said material including nitrogen as the constituent element is silicon nitride.

9. A method for fabricating a nitride-based semiconductor light emitting device, claimed in claim 7 wherein the coverage of said mask is not greater than 50%.

10. A method for fabricating a nitride-based semiconductor light emitting device, claimed in claim 7, the step of forming at least a first nitride-based semiconductor layer comprising:
    forming on the substrate at least one layer including at least a nitride-based semiconductor layer of a first conductivity type,
    forming at least one nitride-based semiconductor layer including at least said active layer, and
    forming at least one nitride-based semiconductor layer including a semiconductor layer of a second conductivity type,
    wherein the opening in said mask is stripe-shaped, and said at least a second nitride-based semiconductor layer includes a nitride-based semiconductor layer of the second conductivity type.

11. A method for fabricating a nitride-based semiconductor light emitting device, claimed in claim 10 wherein said material including nitrogen as the constituent element is silicon nitride.

12. A method for fabricating a nitride-based semiconductor light emitting device, claimed in claim 11 wherein the coverage of said mask is not greater than 50%.

13. A method for fabricating a nitride-based semiconductor light emitting device claimed in claim 1, wherein said selectively crystal-growing at least a second nitride-based semiconductor layer in an opening of said mask further comprises:
    growing said at least a second nitride-based semiconductor layer in said opening at a growth temperature which is higher than a temperature where the material of said mask is decomposed,
    while growing said at least a second nitride-based semiconductor layer, suppressing decomposition of the mask by having a partial pressure of nitrogen that balances separation of nitrogen from said mask with absorption of nitrogen to said mask.

14. A method for fabricating a nitride-based semiconductor light emitting device claimed in claim 4 wherein said selectively crystal-growing at least a second nitride-based semiconductor layer in an opening of said mask further comprises:

growing said at least a second nitride-based semiconductor layer in said opening at a growth temperature which is higher than a temperature where the material of said mask is decomposed, while growing said at least a second nitride-based semiconductor layer, suppressing decomposition of the mask by having a partial pressure of nitrogen that balances separation of nitrogen from said mask with absorption of nitrogen to said mask.

15. A method for fabricating a nitride-based semiconductor light emitting device claimed in claim 7, wherein said selectively crystal-growing at least a second nitride-based semiconductor layer in an opening of said mask further comprises:

growing said at least a second nitride-based semiconductor layer in said opening at a growth temperature which is higher than a temperature where the material of said mask is decomposed, while growing said at least a second nitride-based semiconductor layer, suppressing decomposition of the mask by having a partial pressure of nitrogen that balances separation of nitrogen from said mask with absorption of nitrogen to said mask.

16. A method for fabricating a nitride-based semiconductor light emitting device claimed in claim 10, wherein said selectively crystal-growing at least a second nitride-based semiconductor layer in an opening of said mask further comprises:

growing said at least a second nitride-based semiconductor layer in said opening at a growth temperature which is higher than a temperature where the material of said mask is decomposed, while growing said at least a second nitride-based semiconductor layer, suppressing decomposition of the mask by having a partial pressure of nitrogen that balances separation of nitrogen from said mask with absorption of nitrogen to said mask.

* * * * *